(12) United States Patent
Vanderpot et al.

(10) Patent No.: US 7,579,604 B2
(45) Date of Patent: Aug. 25, 2009

(54) BEAM STOP AND BEAM TUNING METHODS

(75) Inventors: John W. Vanderpot, Boxford, MA (US); Yongzhang Huang, Hamilton, MA (US)

(73) Assignee: Axcelis Technologies Inc., Beverly, MA (US)

( * ) Notice: Subject to any disclaimer, the term of this patent is extended or adjusted under 35 U.S.C. 154(b) by 427 days.

(21) Appl. No.: 11/445,722

(22) Filed: Jun. 2, 2006

(65) Prior Publication Data
US 2006/0284071 A1    Dec. 21, 2006

Related U.S. Application Data

(60) Provisional application No. 60/687,514, filed on Jun. 3, 2005.

(51) Int. Cl.
*G21K 5/10* (2006.01)
*H01J 37/08* (2006.01)

(52) U.S. Cl. .............. 250/492.21; 250/492.1; 250/396 R; 250/397; 250/400; 250/492.3; 250/398; 250/251; 250/492.22; 250/396 ML; 427/523; 204/298.04; 200/252

(58) Field of Classification Search .............. 250/492.1, 250/396 R, 398, 492.2, 423 R, 397, 400, 250/492.3, 251, 492.22, 396 ML; 427/523; 204/298.04; 200/252
See application file for complete search history.

(56) References Cited

U.S. PATENT DOCUMENTS 5,134,299 A    7/1992  Denholm
6,501,078 B1   12/2002 Ryding et al.
6,661,016 B2   12/2003 Berrian
2002/0053642 A1 5/2002 Berrian

FOREIGN PATENT DOCUMENTS

EP    1030344 A2    8/2000
GB    2345574 A *   7/2000

OTHER PUBLICATIONS

International Search Report for International Patent Application PCT/US06/021647; Mailing Date of Mar. 9, 2007, p. 1-6.
U.S. Appl. No. 11/455,667, filed Jun. 2, 2006, Berrian et al., Entire Document.
U.S. Appl. No. 11/445,677, filed Jun. 2, 2006, Vanderpot et al., Entire Document.

* cited by examiner

*Primary Examiner*—Jack I Berman
*Assistant Examiner*—Meenakshi S Sahu
(74) *Attorney, Agent, or Firm*—Eschweiler & Associates, LLC

(57) ABSTRACT

A system, method, and apparatus for mitigating contamination associated with ion implantation are provided. An ion source, end station, and mass analyzer positioned between the ion source and the end station are provided, wherein an ion beam is formed from the ion source and selectively travels through the mass analyzer to the end station, based on a position of a beam stop assembly. The beam stop assembly selectively prevents the ion beam from entering and/or exiting the mass analyzer, therein minimizing contamination associated with an unstable ion source during transition periods such as a start-up of the ion implantation system.

32 Claims, 3 Drawing Sheets

BEAM STOP AND BEAM TUNING METHODS

REFERENCE TO RELATED APPLICATION

This application claims priority to and the benefit of U.S. Provisional Application Ser. No. 60/687,514 which was filed Jun. 3, 2005, entitled PARTICULATE PREVENTION IN ION IMPLANTATION, the entirety of which is hereby incorporated by reference as if fully set forth herein.

FIELD OF THE INVENTION

The present invention relates generally to an ion implantation system, apparatus, and method for implanting ions into a workpiece, and more specifically to a system, apparatus, and method for generally preventing particulate contamination associated with an ion beam.

BACKGROUND OF THE INVENTION

In the manufacture of semiconductor devices, ion implantation systems are employed to dope a semiconductor wafer or other workpiece with impurities. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

Typically, the ions generated from the ion source are formed into a beam and directed along a predetermined beam path to an implantation station. The ion beam implanter may further include beam forming and shaping structures extending between the ion source and the implantation station. The beam forming and shaping structures attempt to maintain the ion beam and bound an elongated interior cavity or passageway through which the beam passes en route to the implantation station. When operating the ion implanter, this passageway is typically evacuated to reduce the probability of ions being deflected from the predetermined beam path as a result of collisions with air molecules.

The mass of an ion relative to the charge thereon (i.e., charge-to-mass ratio) affects the degree to which it is accelerated both axially and transversely by an electrostatic or magnetic field. Therefore, the beam that reaches a desired area of a semiconductor wafer or other target can be made quite pure, since ions of undesirable molecular weight will be deflected to positions away from the beam and implantation of ions of other than the desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

The ion beam is typically focused and directed at a desired surface region of the workpiece. Generally, the energetic ions of the ion beam are accelerated to a predetermined energy level to penetrate into the bulk of the workpiece. The ions, for example, are embedded into the crystalline lattice of the material to form a region of desired conductivity, with the energy of the ion beam generally determining the depth of implantation. Examples of ion implantation systems include those available from Axcelis Technologies of Beverly, Mass.

Operation of a typical ion implanter or other ion beam equipment (e.g., a linear accelerator), however, may result in the production of contaminant particles from various sources. The contaminant particles, for example, may be less than about 1 µm in size, yet still have a deleterious effect on the implanted workpiece. The contaminant particles, for example, may become entrained in the ion beam and transported with the beam toward the workpiece, thus resulting in undesired contamination at the workpiece.

In a typical ion implantation system, for example, one source of contaminant particles is material associated with the passageway through the mass analyzer. For example, the passageway of the mass analyzer is typically coated with graphite, wherein the ions of undesirable molecular weight generally impact the graphite lining the passageway and become generally entrained in the graphite coating. Over time, however, as ions continue to strike the graphite coating, particles of the graphite coating may become dislodged from the passageway and then become entrained in the ion beam. Subsequently, these contaminant particles within the ion beam can collide with and adhere to the workpiece or other substrate during ion implantation, and can consequently become a source of yield loss in the fabrication of semiconductor and other devices that require submicroscopic pattern definition on the treated workpieces. Such contamination may be significantly increased during a tuning of the ion implantation system, such as during a startup operation of the system, wherein the ion beam is substantially unstable.

As semiconductor devices are manufactured at reduced sizes with greater precision, higher accuracy and efficiency are required of apparatuses for manufacturing such semiconductor devices. Accordingly, it is desirable to reduce the level of contaminant particles in the ion beam at various positions upstream of the workpiece, so as to mitigate workpiece contamination.

SUMMARY OF THE INVENTION

The present invention overcomes the limitations of the prior art by providing an apparatus, system, and method for controlling contamination associated with an ion beam at various positions upstream of a workpiece. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

According to one exemplary aspect of the present invention, a beam stop assembly is provided for reducing contamination of an ion beam emanating from an ion source in an ion implantation system, wherein the beam stop assembly comprises a movable beam stop that is selectively positionable with respect to a path of the ion beam. The beam stop, for example, comprises a plate that may be positioned at an entrance and/or and exit of a mass analyzing magnet (i.e., a "mass analyzer"), wherein the beam stop assembly is operable to constrain particle contamination associated with a tuning of the ion beam (e.g., during a startup of the ion implantation system) to within a particular region of the ion implantation system. For example, selectively positioning the beam stop at an entrance of the mass analyzer along the ion beam path selectively prevents the ion beam (and particle contamination associated therewith) from entering the mass analyzer during an initial tuning of an ion source associated with the ion beam.

In accordance with the present invention, the plate comprises a carbon-containing material, such as graphite, wherein the carbon-containing material is operable to substantially absorb the ion beam and contamination associated therewith. The beam stop assembly is therefore operable to reduce an amount of time during which the ion beam is operable to strike a surface associated with the mass analyzer or other components of the ion implantation system. According to another example, a measurement device is provided upstream of the beam stop, wherein one or more properties of the ion beam may be measured while the beam stop generally blocks the ion beam. The one or more measured properties of the ion beam may be utilized to tune one or more of the ion source and the mass analyzer prior to implanting ions into the workpiece. A pump may be further provided, wherein the pump is operable to pump or exhaust gaseous and/or suspended particles away from the beam stop assembly, thus further reducing particle contamination.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
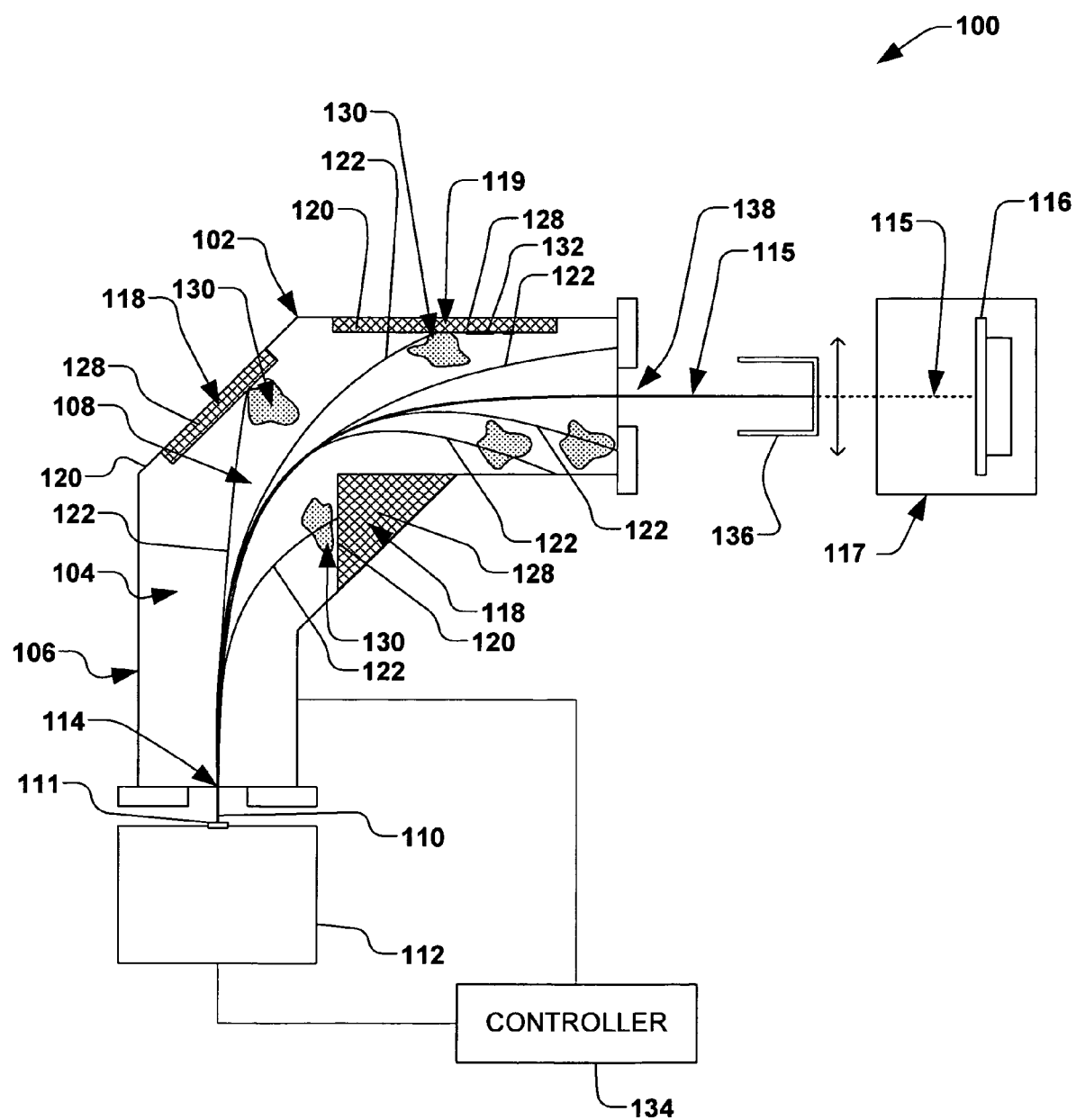
FIG. 1 is a plan view of an exemplary ion implantation system according to one aspect of the present invention.

The present invention is directed generally towards systems, apparatuses, and methods for generally mitigating particulate contamination of a workpiece being subjected to an ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a simplified perspective view of an exemplary ion implantation system 100. It should be noted that the ion implantation system 100 of FIG. 1 is illustrated to provide an upper-level understanding of the invention, and is not necessarily drawn to scale. Accordingly, various components may or may not be illustrated for clarity purposes. FIG. 1 illustrates the top view of a vacuum chamber 102 that is inside a main magnetic field 104 of a mass analyzer 106 (also called a "magnet"), wherein a center 108 of the magnetic field is further shown. An undifferentiated ion beam 110 enters the mass analyzer 106 from an exit aperture 111 of ion source 112 through an entrance 114 of the mass analyzer, and the magnet begins to separate the undifferentiated ion beam, based, at least in part, on the molecular weight of elements comprising the ion beam. The mass analyzer 106 is operable to extract a desired or selected ray or ion beam 115 of a selected element (e.g., boron) from the undifferentiated ion beam 110, wherein ions of the selected beam are desirably implanted into a workpiece 116 (e.g., a semiconductor substrate) positioned within an end station 117. Lighter elements (e.g., hydrogen) that have lower molecular weights than the selected element tend to turn toward a first region 118, while heavier elements that are heavier in molecular weight than the selected element tend to turn toward a second region 119. Typically, the lightest elements that impact the first region 118 do not cause significant damage to the vacuum chamber 102 upon striking a wall 120 of the chamber, however, the heaver elements that strike the walls 120 of the chamber in the second region 119 tend to cause more damage, due, at least in part, to their higher mass.

Elements that are not of the selected molecular weight (i.e., undesirable elements that are not in the selected beam 115) are called waste beams 122, since they are beams that are comprised of material that is not intended to be implanted into the workpiece 116 positioned in the end station 117. The walls 120 of the chamber 102 are generally lined with graphite 128, wherein upon the waste beams 122 striking the walls, the elements comprising the waste beams become entrained in the graphite. However, depending on the angle at which the waste beams 122 strike the graphite 128 of the walls 120, the elements of the waste beams may fail to bury themselves within the walls, and may further sputter some of the graphite away from the walls. In many cases, the undifferentiated ion beam 110 may comprise highly reactive materials or elements, such as fluorine, wherein the highly reactive materials may further remove material from the walls 120. The waste beams 122 may therefore cause clouds 130 of contamination particles (e.g., highly chemically reactive particles) to become lofted inside the vacuum chamber 102. Over time, the clouds 130 of contamination may build up, thus causing flakes 132 of the deleterious material to form and thicken on the walls 120 and other interior components. Eventually, the flakes 132 may spall off the walls 120 and other interior components, and become entrained in the selected ion beam 115, thereby leading to contamination on the workpiece 116.

The present invention contemplates that the ion source 112 generally requires tuning of the undifferentiated ion beam 110 in order to provide the selected ion beam 115, wherein the tuning is generally performed while the ion source is running (e.g., power and gases are supplied to the ion source, wherein the ion beam 110 is formed). For example, the ion beam undifferentiated 110 is generally unanalyzed at the entrance 114 of the mass analyzer 106, wherein all components of the ion beam are present. The undifferentiated ion beam 110 may comprise gases or materials comprising boron (B), fluorine (F), boron difluoride ($BF_2$), and other components prior to entering the mass analyzer 106, and in tuning the ion source 112, the mixture and electrical potential of the gases and materials are desirably set or "dialed in" via a controller 134, such that the resulting desired or selected ion beam 115 is substantially stable and possesses the desired qualities prior to implanting ions into the workpiece 116. During tuning of the ion source 112, such as when cold-starting the ion implantation system 100 in the beginning of the day, the resultant undifferentiated ion beam 110 generally has a tendency to "misbehave", wherein sparks, flutter, and various other deleterious reactions can occur. Such misbehavior of the ion beam 110 during tuning can deleteriously accentuate the generation of the clouds 130 of contaminant particles within the vacuum chamber 102. These contaminant particles may pass through the mass analyzer 106 and be caught in a set up flag faraday 136 that is positioned to selectively block the selected ion beam 115 at an exit 138 of the mass analyzer. However, in some instances, these contaminant particles can still eventually make their way to the workpiece 116 during implantation, thus negatively effecting product yield and performance of the resulting implanted workpiece.

Figure 2:
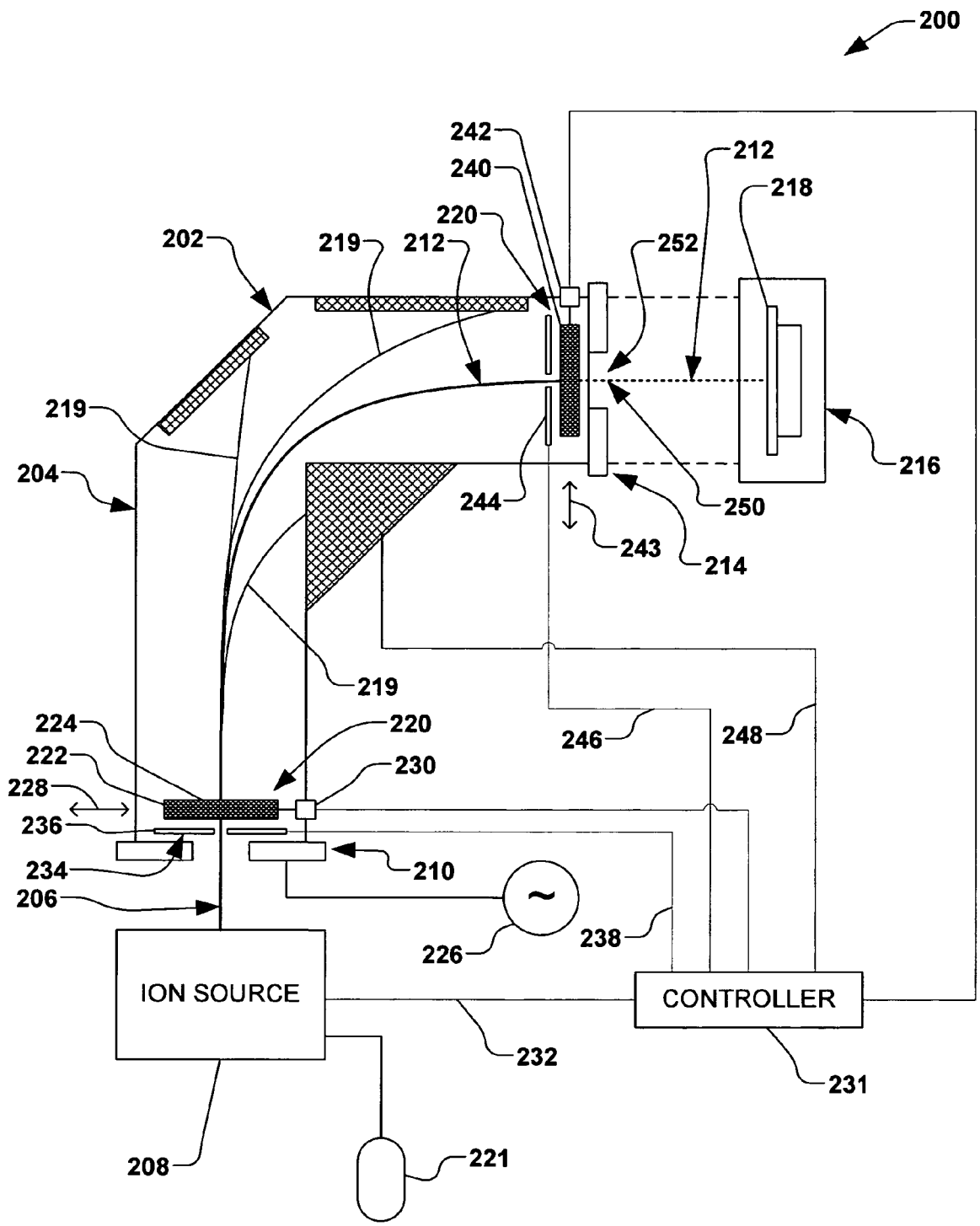
FIG. 2 is a plan view of an exemplary ion implantation system comprising a beam stop assembly according to another aspect of the present invention.

The present invention is directed to minimizing an amount of contamination that enters and/or exits the mass analyzer 106, thus minimizing contamination of the workpiece 116. According to one aspect of the present invention, an exemplary ion implantation system 200 is illustrated in FIG. 2, wherein the ion implantation system illustrates several inventive aspects of the invention. It shall be understood that the various features illustrated can be of various shapes and sizes, or excluded altogether, and that all such shapes, sizes, and exclusions are contemplated as falling within the scope of the present invention. Similar to the ion implantation system 100 of FIG. 1, the ion implantation system 200 of FIG. 2 comprises a vacuum chamber 202 disposed within a mass analyzer 204, wherein an undifferentiated ion beam 206 is operable to enter the mass analyzer from an ion source 208 through an entrance 210 of the mass analyzer. The mass analyzer 204 is operable to extract a desired or selected ion beam 212 of the undifferentiated ion beam 206 and direct the selected ion beam through an exit 214 of the mass analyzer and towards an end station 216, wherein a workpiece 218 generally resides therein. During a mass analysis within the mass analyzer 204, elements of the undifferentiated ion beam 206 that are not of the same species as selected ion beam 212 generally form an arc of greater or lesser degrees than the selected ion beam (e.g., illustrated waste beams 219), as described above.

In accordance with the present invention, undesirable particle contamination of the selected ion beam 212, such as that discussed above with reference to FIG. 1, can be mitigated during a start-up and/or shut-down of the ion implantation system (e.g., "transition periods" wherein the undifferentiated ion beam 206 may be unstable) by one or more beam stop assemblies 220 illustrated in FIG. 2, as will now be discussed. As described above, the undifferentiated ion beam 206 is generally unanalyzed at the entrance 210 of the mass analyzer 204, and all components (e.g., all species of the ions formed in the ion source 208) of the ion beam are generally present in the undifferentiated ion beam. Accordingly, during start-up of the ion implantation system 200, the ion source 208 is "tuned", wherein an electrical potential and mixture of the gases and/or materials 221 within the ion source are desirably set or "dialed in", such that the resulting undifferentiated ion beam 206 is substantially stable and possesses the desired qualities prior to implanting ions into the workpiece 218. However, as stated above, such a tuning of the ion source 208 has conventionally led to enhanced particle generation, since the ion source can be substantially unstable during transition periods.

Therefore, according to one exemplary aspect of the invention, a moveable entrance beam stop 222 (e.g., a physical block or "entrance stop") is provided at the entrance 210 of the mass analyzer 204, wherein the ion beam 206 is selectably prevented from penetrating into the mass analyzer. It should be noted that while the one or more beam stop assemblies 220 are illustrated as being within the mass analyzer 204, the one or more beam stop assemblies may reside near the mass analyzer, while not being generally contained therein, and all such positions of the one or more beam stop assemblies near the mass analyzer are contemplated as falling within the scope of the present invention.

The entrance beam stop 222, for example, may comprise a plate 224 that is generally comprised of carbon (e.g., graphite), or may be comprised of a variety of other materials, such as silicon carbide, or comprise a carbon-based coating, wherein the entrance beam stop is operable to generally absorb the undifferentiated ion beam 206 during transition periods. Particles (not shown) of the undifferentiated ion beam 206 that are in gaseous form or are substantially light in weight but not absorbed by the entrance beam stop 222 when the entrance beam stop generally prevents the ion beam entering the mass analyzer 204, for example, may be pumped away from the entrance 210 of the mass analyzer via a pump 226.

The entrance beam stop 222, for example, is slidingly or pivotably coupled (e.g., as illustrated by arrow 228) to the mass analyzer 204 via an actuator 230, wherein the entrance beam stop is operable to selectively cover or substantially block the entrance 210 of the mass analyzer, therein generally preventing the undifferentiated ion beam 206 from entering the mass analyzer. Accordingly, the entrance beam stop 222 may be selectively positioned in front of the entrance 210 until the ion source 208 is substantially stabilized, and may then be translated to permit the ion beam 206 to enter the mass analyzer thereafter. A controller 231, for example, is operable to selectively control the one or more beam stop assemblies 220 (e.g., control the actuator 230) such that the one or more beam stop assemblies selectively limit a trajectory of the ion beam 206. The controller 231 may further control the ion source 208 and the electrical potential and mixture of the gases and/or materials 221 via one or more control signals 232 during tuning of the ion source.

According to another exemplary aspect of the invention, a measurement device 234, such as a tuning aperture 236 or other measurement device such as an electrode or wire scanner is provided at the entrance 210 of the mass analyzer 204. The measurement device 234, for example, is operable to measure one or more properties 238 of the undifferentiated ion beam 206 in order to tune the ion beam for stability and/or to center the ion beam right, left, up, and down prior to the ion beam entering the vacuum chamber 202 (or at least prior to the ion beam substantially entering the vacuum chamber). The measurement device 234 may provide the one or more properties 238 to the controller 231, wherein the controller is operable to control one or more of the mass analyzer 204 and ion source 208 based, at least in part, on the one or more measured properties of the ion beam 206. Accordingly, the ion source 208, and thus, the undifferentiated ion beam 206, can be tuned before the ion beam enters into the mass analyzer 204, thus generally limiting particles (not shown) that may be generated within the mass analyzer if the un-tuned ion beam were to enter the mass analyzer. Thus, the ion source 208 can be "warmed up" and/or stabilized, wherein the undifferentiated ion beam 206 can be further orientated (e.g., centered) before the ion beam is permitted to enter into the mass analyzer 204, such as via a combination of the tuning aperture 236 and the entrance beam stop 222. Accordingly, such a stabilization of the ion source 208 while the entrance 210 of the mass analyzer is blocked by the entrance beam stop 222 generally prevents deleterious contamination of the mass analyzer 204 and other downstream components.

According to another exemplary aspect of the invention, the one or more beam stop assemblies 220 further comprise a moveable exit beam stop 240 is provided at the exit 214 of the mass analyzer 204. The exit beam stop 240, for example, is operably coupled to another actuator 242 (e.g., similar to the actuator 230), wherein the controller 231 is operable to selectively translate the exit beam stop 240 (e.g., illustrated by arrow 243) via the actuator 242 in order to selectively permit the desired or selected ion beam 212 to exit the mass analyzer 204 after the undifferentiated ion beam 206 is mass analyzed. Another measurement device 244 (e.g., similar to the measurement device 236) may be utilized to measure one or more properties 246 of the selected ion beam 212 for further control of the ion implantation system 200 via the controller 231.

According to yet another example, after the undifferentiated ion beam 206 has been stabilized by the tuning discussed above (e.g., utilizing the entrance beam stop 222 and measurement device 232), the desired ion beam 212 is pre-selected by a current 248 provided to the mass analyzer 204 via the controller 231. For example, prior to the entrance beam stop 222 being opened (e.g., before permitting the undifferentiated ion beam 206 to enter the mass analyzer 204), the current 244 to the mass analyzer is preset such that magnets (not shown) associated with the mass analyzer are tuned to theoretically provide the selected or desired ion beam 212 at a center 250 of an exit aperture 252 of the mass analyzer. The current 248 provided to the mass analyzer 204, for example, can be determined by an atomic mass unit (AMU) calculation, wherein the calculation can be performed for a desired mass (e.g., the desired species of implant) and energy, and wherein the appropriate magnetic field is generally determined by the AMU calibration. The exit beam stop 240 and measurement device 244 may then be utilized to determine the position of the position of the selected or desired ion beam 212 with respect to the exit aperture 252 for use in further tuning the ion implantation system.

Figure 3:
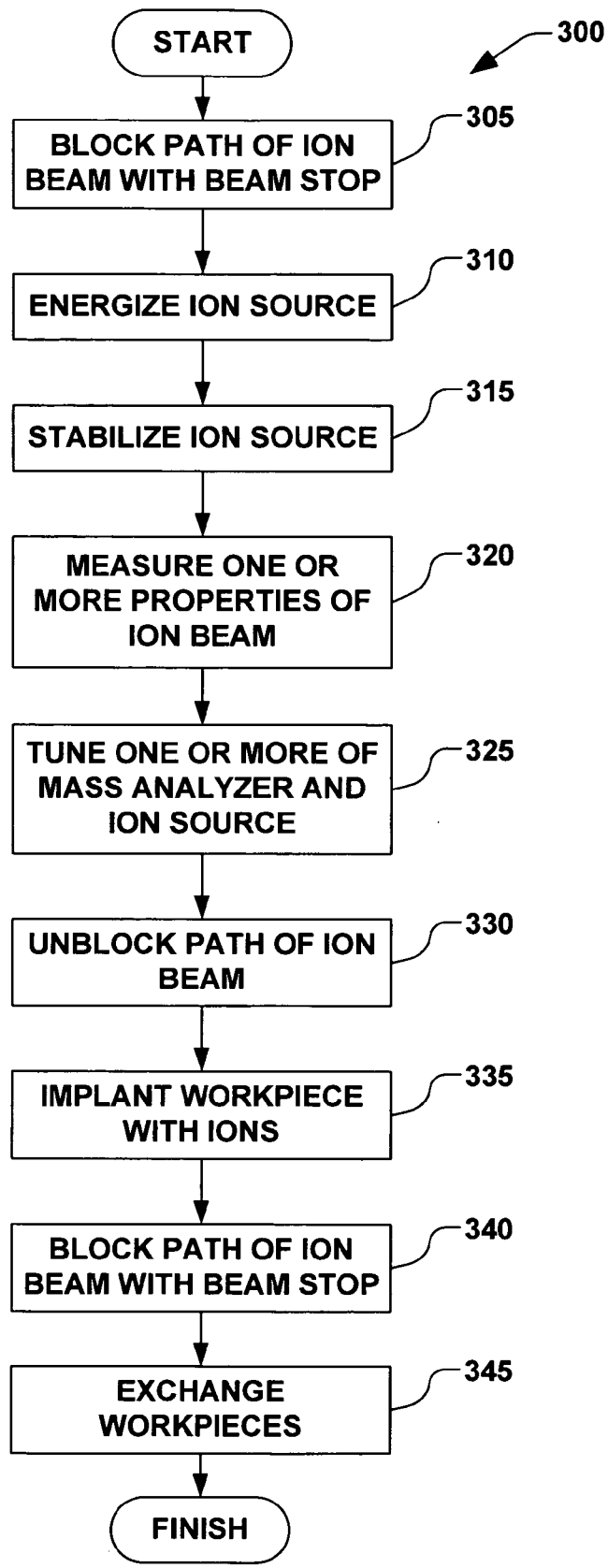
FIG. 3 is a block diagram of a method for controlling contamination in an ion implantation system according to another exemplary aspect of the invention.

According to still another exemplary aspect of the present invention, FIG. 3 is a schematic block diagram of an exemplary method 300 illustrating a method for controlling particulate contamination within an ion implantation system, such as the ion implantation system 200 of FIG. 2. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 3, the method 300 begins with generally blocking an entrance of a mass analyzer with an entrance beam stop in act 305. Ions are energized in an ion source in act 310, wherein the ions are generally extracted from the ion source in the form of an undifferentiated ion beam. In act 315, the ion source is generally normalized, wherein the undifferentiated ion beam is generally stabilized. In accordance with one exemplary aspect of the invention, one or more properties of the undifferentiated ion beam may be measured in act 320, wherein one or more of the mass analyzer and ion source are controlled and/or tuned in act 325 based, at least in part, on the one or more measured properties. In act 330, the entrance beam stop is generally translated such that the undifferentiated ion beam is permitted to enter the mass analyzer for mass analysis thereof, therein substantially mitigating contamination from an unstable ion beam during startup of the ion implantation system.

According to another exemplary aspect of the invention, after tuning the system, the ion implantation system can implant ions into a workpiece in act 335, such as a semiconductor wafer that is placed in an end station along a path of the ion beam. Subsequent to the ion implantation into the workpiece in act 335, the entrance and/or exit beam stop can further block the ion beam when performing an exchange of workpieces. For example, in act 340, the path of the ion beam is again blocked, wherein the workpiece is subsequently exchanged in act 345, wherein a new unimplanted workpiece is ready to be implanted with ions.

Accordingly, a duty time during which the beamline assembly downstream of the entrance beam stop (e.g., the mass analyzer, etc.) is exposed to the ion beam is significantly reduced (such as during workpiece exchanges), thus reducing a build of particulate contamination and flakes. After the workpiece is exchanged, the entrance beam stop unblocks the path of the ion beam, and another ion implantation can be performed on the subsequent workpiece. The blocking of the ion beam, exchange of workpieces, and unblocking of the beam can be performed repeatedly, such as to implant batches of workpieces in a serial manner, while also reducing contamination within the ion implantation system.

Accordingly, the present invention generally provides a level of particle control that is presently unseen in the ion implantation industry. Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising." Also, the term "exemplary", as utilized herein, simply denotes an illustrative example or instance, and not necessarily a preferred embodiment, unless otherwise indicated.

What is claimed is:

1. A beam stop assembly for a mass analyzer, wherein the beam stop assembly comprises an entrance beam stop generally positioned near an entrance of the mass analyzer along a path of an ion beam, and wherein the entrance beam stop is selectively positionable with respect to the ion beam, wherein the entrance beam stop is operable to selectively prevent the ion beam from entering the mass analyzer based on a position of the entrance beam stop with respect to the ion beam, wherein in a first position, the entrance beam stop generally blocks the path of the ion beam near the entrance of the mass analyzer, therein generally preventing the entirety of the ion beam from entering the mass analyzer, and wherein in a second position, the entrance beam stop generally permits the ion beam to enter the mass analyzer.

2. The beam stop assembly of claim 1, wherein the entrance beam stop comprises a plate slidingly coupled to the mass analyzer.

3. The beam stop assembly of claim 1, comprising an actuator operably coupled to the plate, wherein the actuator is operable to selectively position the plate.

4. The beam stop assembly of claim 3, wherein the actuator comprises a rotary actuator operable to selectively rotate the plate through the path of the ion beam.

5. The beam stop assembly of claim 3, wherein the actuator comprises a linear actuator operable to selectively linearly translate the plate through the path of the ion beam.

6. The beam stop assembly of claim 2, wherein the plate comprises a carbon-based material.

7. The beam stop assembly of claim 6, wherein the carbon-based material comprises graphite.

8. The beam stop assembly of claim 1, further comprising a measurement device positioned upstream of the entrance beam stop, wherein the measurement device is operable to detect one or more properties of the ion beam.

9. The beam stop assembly of claim 8, wherein the measurement device comprises one or more of a measurement aperture, a measurement electrode, and a wire scanner.

10. The beam stop assembly of claim 1, further comprising an exit beam stop generally positioned near an exit of the mass analyzer along the path of the ion beam, wherein the exit beam stop is selectively positionable with respect to the ion beam, and wherein the exit beam stop is operable to selectively prevent the ion beam from exiting the mass analyzer based on a position of the exit beam stop with respect to the ion beam.

11. The beam stop assembly of claim 10, further comprising a measurement device positioned upstream of the exit beam stop, wherein the measurement device is operable to detect one or more properties of the ion beam.

12. The beam stop assembly of claim 11, wherein the measurement device comprises one or more of a measurement aperture, a measurement electrode, and a wire scanner.

13. An ion implantation system, comprising:
an ion source having an exit aperture, wherein the ion source is operable to form an ion beam through the exit aperture;
a mass analyzer;
a beam stop assembly, wherein the beam stop assembly comprises an entrance beam stop generally positioned near an entrance of the mass analyzer along a path of the ion beam, and wherein the entrance beam stop is selectively positionable with respect to the ion beam, wherein the entrance beam stop is operable to selectively prevent the ion beam from entering the mass analyzer based on a position of the entrance beam stop with respect to the ion beam, wherein in a first position, the entrance beam stop generally blocks the path of the ion beam near the entrance of the mass analyzer, therein generally preventing the entirety of the ion beam from entering the mass analyzer, and wherein in a second position, the entrance beam stop generally permits the ion beam to enter the mass analyzer; and
a controller operable to control the position of the entrance beam stop, wherein the control is based on a stability of the ion beam formed from the ion source.

14. The ion implantation system of claim 13, comprising an actuator operably coupled to the entrance beam stop, wherein the actuator is operable to selectively position the entrance beam stop, based, at least in part, on the stability of the ion beam.

15. The ion implantation system of claim 14, wherein the actuator comprises a rotary actuator operable to selectively rotate the entrance beam stop through the path of the ion beam.

16. The ion implantation system of claim 14, wherein the actuator comprises a linear actuator operable to selectively linearly translate the entrance beam stop through the path of the ion beam.

17. The ion implantation system of claim 13, wherein the entrance beam stop comprises graphite plate.

18. The ion implantation system of claim 13, further comprising a measurement device positioned upstream of the entrance beam stop, wherein the measurement device is operable to detect one or more properties of the ion beam, wherein controller is operable to determine the stability of the ion beam based on the one or more properties.

19. The ion implantation system of claim 18, wherein the measurement device comprises one or more of a measurement aperture, a measurement electrode, and a wire scanner.

20. The ion implantation system of claim 13, further comprising an exit beam stop generally positioned near an exit of the mass analyzer along the path of the ion beam, wherein the exit beam stop is selectively positionable with respect to the ion beam, and wherein the exit beam stop is operable to selectively prevent the ion beam from exiting the mass analyzer based on a position of the exit beam stop with respect to the ion beam.

21. The ion implantation system of claim 20, further comprising a measurement device positioned upstream of the exit beam stop, wherein the measurement device is operable to detect one or more properties of the ion beam, wherein controller is operable to determine the stability of the ion beam based on the one or more properties.

22. The ion implantation system of claim 21, wherein the measurement device comprises one or more of a measurement aperture, a measurement electrode, and a wire scanner.

23. A method for preventing particle contamination in an ion implantation system, the method comprising the act of:
selectively blocking an entrance of a mass analyzer;
energizing ions in an ion source, therein forming an undifferentiated ion beam, wherein selectively blocking the entrance of a mass analyzer comprises generally preventing the entirety of the undifferentiated beam from entering the mass analyzer; and
selectively unblocking the entrance of the mass analyzer once the ion source has substantially stabilized.

24. The method of claim 23, further comprising:
measuring one or more properties of an undifferentiated ion beam near the entrance of the mass analyzer; and
controlling one or more of the ion source and mass analyzer based on the one or more measured properties of the undifferentiated ion beam.

25. The method of claim 24, further comprising:
selectively blocking an exit of the mass analyzer;
mass analyzing the undifferentiated ion beam, therein defining a selected ion beam;
measuring one or more properties of the selected ion beam near the exit of the mass analyzer; and
controlling one or more of the ion source and mass analyzer based on the one or more measured properties of the selected ion beam.

26. The method of claim 25, further comprising placing a workpiece along a path of the ion beam when the exit of the mass analyzer is blocked, and implanting ions into the workpiece when the exit is unblocked.

27. The method of claim 26, further comprising removing the workpiece from the path of the ion beam when the exit of the mass analyzer is blocked after the ions are implanted into the workpiece.

28. The method of claim 23, further comprising placing a workpiece along a path of the ion beam when the entrance of the mass analyzer is blocked, and implanting ions into the workpiece when the entrance is unblocked.

29. The method of claim 28, further comprising removing the workpiece from the path of the ion beam when the entrance of the mass analyzer is blocked after the ions are implanted into the workpiece.

30. The beam stop assembly of claim 1, wherein the ion beam comprises an undifferentiated ion beam near the entrance of the mass analyzer, and wherein the entrance beam stop is configured to generally prevent the entirety of the undifferentiated ion beam from entering the mass analyzer based on the position of the entrance beam stop with respect to the undifferentiated ion beam.

31. The ion implantation system of claim 13, wherein the ion beam comprises an undifferentiated ion beam near the entrance of the mass analyzer, and wherein, the entrance beam stop is configured to generally prevent the entirety of the undifferentiated ion beam from entering the mass analyzer based on the position of the entrance beam stop with respect to the undifferentiated ion beam.

32. The method of claim 23, wherein selectively blocking the entrance of the mass analyzer comprises placing an entrance beam stop in a first position near the entrance of the mass analyzer, therein generally blocking the entirety of the undifferentiated ion beam from entering the mass analyzer when the entrance beam stop is in the first position, and wherein selectively unblocking the entrance of the mass analyzer comprises placing the entrance beam stop in a second position, therein generally permitting the undifferentiated ion beam to enter the mass analyzer when the entrance beam stop is in the second position.

* * * * *